(12) United States Patent
Oda et al.

(10) Patent No.: US 10,558,011 B2
(45) Date of Patent: Feb. 11, 2020

(54) VIBRATION ACTUATOR AND ELECTRONIC APPARATUS USING VIBRATION ACTUATOR

(71) Applicant: CANON KABUSHIKI KAISHA, Tokyo (JP)

(72) Inventors: Yuki Oda, Yokohama (JP); Hiroyuki Seki, Oyama (JP)

(73) Assignee: Canon Kabushiki Kaisha, Tokyo (JP)

( * ) Notice: Subject to any disclaimer, the term of this patent is extended or adjusted under 35 U.S.C. 154(b) by 378 days.

(21) Appl. No.: 15/485,652

(22) Filed: Apr. 12, 2017

(65) Prior Publication Data
US 2017/0315325 A1 Nov. 2, 2017

(30) Foreign Application Priority Data
Apr. 28, 2016 (JP) ................................ 2016-090976

(51) Int. Cl.
*H01L 41/09* (2006.01)
*G02B 7/09* (2006.01)
*B06B 1/06* (2006.01)

(52) U.S. Cl.
CPC .............. *G02B 7/09* (2013.01); *B06B 1/0648* (2013.01); *H01L 41/09* (2013.01)

(58) Field of Classification Search
CPC ....... H01L 41/09; B06B 1/0648; H02N 2/006; H02N 2/026; G02B 7/09; G02B 7/08
See application file for complete search history.

(56) References Cited

U.S. PATENT DOCUMENTS

| | | | |
|---|---|---|---|
| 7,969,065 B2 | 6/2011 | Seki et al. | |
| 8,339,016 B2 | 12/2012 | Seki et al. | |
| 8,643,252 B2 | 2/2014 | Oda et al. | |
| 8,816,568 B2 | 8/2014 | Seki et al. | |
| 2011/0228389 A1* | 9/2011 | Ohashi | G02B 27/0006 359/507 |
| 2015/0137663 A1 | 5/2015 | Kimura et al. | |
| 2016/0020710 A1 | 1/2016 | Oda et al. | |
| 2017/0104934 A1 | 4/2017 | Oda et al. | |

FOREIGN PATENT DOCUMENTS

| | | |
|---|---|---|
| JP | 5590795 B2 | 9/2014 |
| JP | 2015-104144 A | 6/2015 |

* cited by examiner

*Primary Examiner* — J. San Martin
(74) *Attorney, Agent, or Firm* — Venable LLP

(57) ABSTRACT

A vibration actuator is capable of bringing a vibration body into press contact with a driven body stably for an extended period while reducing obstruction of excitation of vibration in the vibration body by the pressing force. The driven body is in contact with the vibration body by a pressing force given by a pressing member. A vibration isolation member is arranged between the vibration body and the pressing member. The vibration body and the driven body move relatively by vibrations in first and second vibration modes that are excited in the vibration body by applying alternating voltage to a piezoelectric device on the vibration body. Face pressure that acts on the piezoelectric device by the pressing force from the pressing member in first and second areas that respectively include nodal lines in the first and second vibration modes and their vicinities is higher than that in other areas.

14 Claims, 10 Drawing Sheets

FIRST VIBRATION MODE

SECOND VIBRATION MODE

VIBRATION ACTUATOR AND ELECTRONIC APPARATUS USING VIBRATION ACTUATOR

BACKGROUND OF THE INVENTION

Field of the Invention

The present invention relates to a vibration actuator and an electronic apparatus using the vibration actuator.

Description of the Related Art

There is a known vibration actuator that has a vibration body, a driven body, and a pressure or pressing means for bringing the vibration body into press contact with the driven body. The driven body is moved relatively to the vibration body by exciting drive vibration in the vibration body and giving friction driving force to the driven body from the vibration body. As an example of a vibration actuator, there is a known configuration where a piezoelectric device is joined to one side of a tabular elastic body and two projections are formed on the other side (see Japanese Laid-Open Patent Publication (Kokai) No. 2015-104144 (JP 2015-104144A) and Japanese Patent Publication No. 5590795 (JP 5590795B)). This vibration actuator is able to give friction driving force to the driven body in a direction that connects the two projections by causing elliptic movements on the front ends of the projections in a plane including the direction that connects the two projections and a projecting direction of the projections.

JP 2015-104144A suggests a configuration that brings a vibration body into pressure contact with a driven body by bringing a vibration isolation member into contact with a piezoelectric device joined to the vibration body and by giving pressure force to the vibration isolation member. In the description of JP 2015-104144A, the vibration isolation member is arranged near a nodal line of vibration in a first vibration mode among vibrations in first and second vibration modes that are generated in the vibration body so as not to obstruct excitation of vibration in the vibration body. Moreover, in the description of JP 5590795B, a vibration damping member (it is equivalent to the vibration isolation member) is arranged at a position where nodal lines of the vibrations in the first and second vibration modes that are generated in the vibration body overlap so as not to obstruct excitation of vibration in the vibration body, and the vibration body is pushed against the driven body by giving pressure force to the vibration damping member.

However, when the nodal line in the first vibration mode is pressed as the configuration described in JP 2015-104144A, an antinode in the second vibration mode will also be simultaneously pressed by the vibration isolation member. Accordingly, there is a problem that a drive performance will be lowered because a resonance frequency in the second vibration mode moves away from a resonance frequency in the first vibration mode largely. Moreover, since the area of the vibration isolation member is small in the configuration described in JP 5590795B, the vibration isolation member will be crushed after lapse of long time, which will extinguish elastic properties and will cause a problem that driving loss becomes large. In the vibration actuator described in JP 5590795B, since the area of the vibration damping member is small, the face pressure that the vibration damping member gives to the vibration body becomes high. Accordingly, even when the pressed position to the vibration body of the vibration damping member shifts from a node slightly, there is a problem that excitation of vibration will be obstructed.

SUMMARY OF THE INVENTION

The present invention provides a vibration actuator that is capable of bringing the vibration body into pressure or press contact with the driven body stably for a long time while reducing obstruction of excitation of vibration in the vibration body by the pressure or pressing force given to the vibration body.

Accordingly, a first aspect of the present invention provides a vibration actuator including a vibration body that has an electro-mechanical energy conversion element, a driven body that is in contact with the vibration body, a pressing member that gives pressure force to the vibration body, and a vibration isolation member that is arranged between the vibration body and the pressing member. The vibration body and the driven body move relatively by a vibration in a first vibration mode and a vibration in a second vibration mode that are excited in the vibration body by applying alternating voltage to the electro-mechanical energy conversion element. Face pressure that acts to the electro-mechanical energy conversion element by the pressure force from the pressing member in both a first area including a part of a nodal line in the first vibration mode and its vicinity and a second area including a part of a nodal line in the second vibration mode and its vicinity is higher than that in the other area.

Accordingly, a second aspect of the present invention provides an electrical apparatus including the vibration actuator of the first aspect, and a member that is moved by the vibration actuator.

The vibration actuator according to the present invention is able to reduce obstruction of excitation of vibration in the vibration body by the pressure force given to the vibration body, and is able to bring the vibration body into pressure or press contact with the driven body stably for a long time. Accordingly, the drive performance is maintainable over a long period of time.

Further features of the present invention will become apparent from the following description of exemplary embodiments with reference to the attached drawings.

DESCRIPTION OF THE EMBODIMENTS

Hereafter, embodiments according to the present invention will be described in detail with reference to the drawings.

Figure 1:
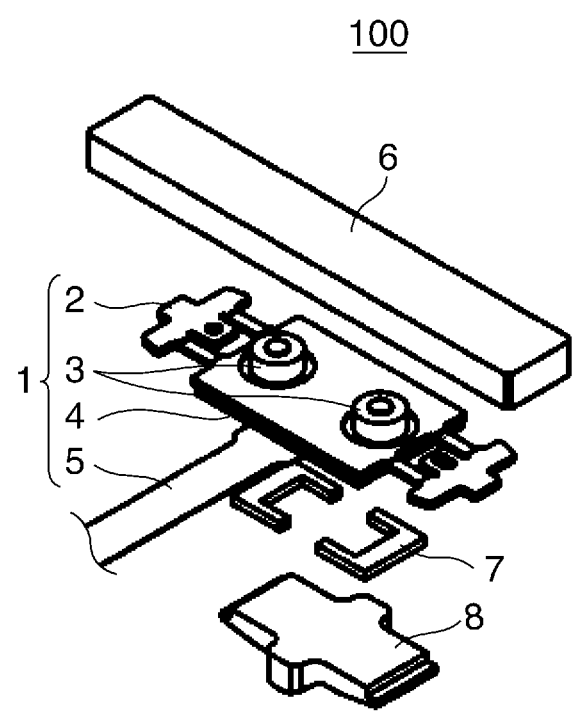
FIG. 1 is an exploded perspective view schematically showing a configuration of a vibration actuator according to a first embodiment of the present invention.

FIG. 1 is an exploded perspective view schematically showing a configuration of a vibration actuator 100 according to a first embodiment of the present invention. The vibration actuator 100 is provided with a vibration body 1, a driven body 6, a pair of vibration isolation members 7, and a pressing member 8. The vibration body 1 has an elastic body 2, two projections 3, a piezoelectric device 4, and a flexible substrate 5.

The plate-shaped elastic body 2 is made from metal material, such as stainless steel (for example, SUS420J2), and has a main part that is approximately rectangular and arms that are formed at both sides of the main part in a longitudinal direction. The arms are fixed to a holding member (not shown). A piezoelectric device 4 is joined to one side of the main part of the elastic body 2. Two projections 3 are provided on the side opposite to the side to which the piezoelectric device 4 is joined. The two projections 3 are disposed apart at a predetermined gap in a relative moving direction of the vibration body 1 and the driven body 6 mentioned later. The two projections 3 are formed integrally with the main part of the elastic body 2 through a press processing of the elastic body 2 in this embodiment. However, the projections 3 may be attached to the elastic body 2 by a method, such as welding, and a method of forming the projections 3 to the elastic body 2 is not limited.

The piezoelectric device 4 that is an electro-mechanical energy conversion element is tabular and approximately rectangular, and is joined to the main part of the elastic body 2 by adhesive, etc. The flexible substrate 5 is attached to the surface of the piezoelectric device 4 using adhesive, etc., and gives the alternating voltage for exciting vibration in the vibration body 1 to the piezoelectric device 4. As mentioned later, a friction driving force is given to the driven body 6 by exciting a predetermined vibration in the vibration body 1 to generate elliptic movements on the projection 3.

A pressurizing means (not shown) gives the pressing member 8 pressure force towards the vibration body 1. The pressing member 8 pushes the vibration body 1 to the driven body 6 through the vibration isolation members 7. Accordingly, the front ends of the projections 3 of the vibration body 1 come into press contact with the driven body 6. A flat spring, a coil spring, a cone spring, etc. can be used as the pressurizing means. The vibration isolation members 7 are elastic members made from material, such as felt, synthetic leather, rubber, and moltoprene. The vibration isolation members 7 are adhered on the pressing member 8 so as to stabilize the contact position to the piezoelectric device 4 (flexible substrate 5). Since the pressure force is transferred to the vibration body 1 from the pressing member 8 through the vibration isolation members 7, obstruction to the vibration excited in the vibration body 1 is reduced (i.e., reduction of the vibration generated in the vibration body 1 due to the pressure force is reduced). It should be noted that the vibration isolation members 7 may be further adhered to the piezoelectric device 4 (flexible substrate 5).

Figure 2A:
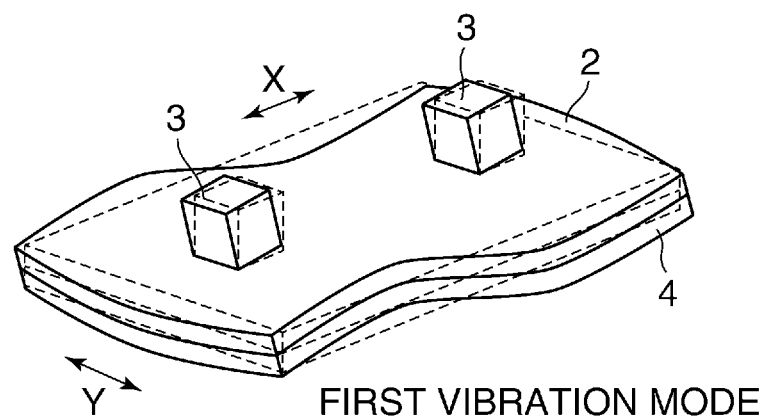
FIG. 2A and FIG. 2B are perspective views describing vibrations in first and second vibration modes excited in a vibration body of the vibration actuator shown in FIG. 1.
Figure 2B:
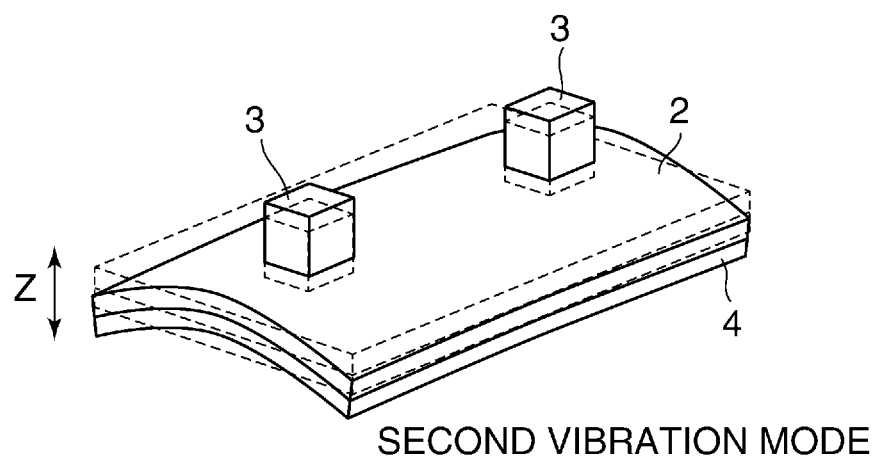

Vibration modes of vibrations excited in the vibration body 1 will be described as follows. FIG. 2A and FIG. 2B are the perspective views describing vibrations in first and second vibration modes excited in the vibration body 1. FIG. 2A schematically shows a vibration of the vibration body in the first vibration mode, and FIG. 2B schematically shows a vibration of the vibration body in the second vibration mode. It should be noted that the shapes of the projections 3 are simplified to prismatic forms in FIG. 2A and FIG. 2B. Moreover, the direction that connects the two projections 3 is defined as an X-direction, the projecting direction of the projections 3 is defined as a Z-direction, and the direction that intersects perpendicularly with both the X-direction and the Z-direction is defined as a Y-direction.

The vibration in the first vibration mode shown in FIG. 2A is a secondary bending vibration in the X-direction, and has three nodal lines that approximately intersect perpendicularly with the X-direction. The two projections 3 are arranged near nodes of the vibration in the first vibration mode, and reciprocate in the X-direction by the vibration in the first vibration mode. The vibration in the second vibration mode shown in FIG. 2B is a primary bending vibration in the Y-direction, and has two nodal lines that approximately intersect perpendicularly with the Y-direction. The two projections 3 are arranged near antinodes of the vibration in the second vibration mode, and reciprocate in the Z-direction by the vibration in the second vibration mode. Elliptic movements (or circular movements) are generated at the front ends of the projections 3 by making the vibration body 1 generate the vibration in the first vibration mode and the vibration in the second vibration mode with a predetermined phase difference. The elliptic movements that occur in the projections 3 give the driven body 6 friction driving force, and accordingly, the vibration body 1 and the driven body 6 move relatively in the X-direction.

Figure 3A:
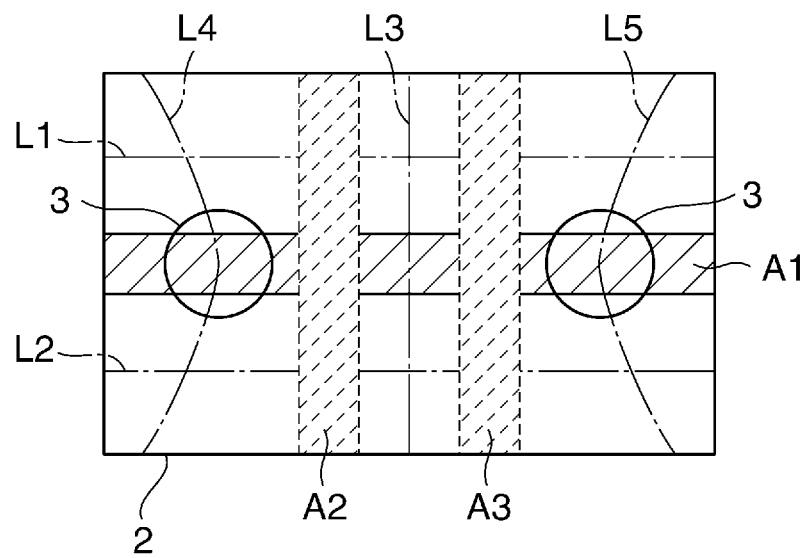
FIG. 3A is a plan view describing nodal lines and an antinode in a first vibration mode and nodal lines and antinodes in a second vibration mode that are excited in the vibration body of the vibration actuator shown in FIG. 1.

FIG. 3A is a plan view describing the nodal lines and the antinodes (areas where the vibration displacements are relatively large) in the first vibration mode and the nodal lines and the antinodes in the second vibration mode. The nodal lines L1 and L2 are nodal lines in the second vibration mode, and the nodal lines L3, L4, and L5 are nodal lines in the first vibration mode. The nodal lines L3 through L5 in the first vibration mode and the nodal lines L1 and L2 in the second vibration mode approximately intersect perpendicularly in the X-Y plane. An area A1 is the antinode of the vibration in the second vibration mode, and areas A2 and A3 are the antinodes of the vibration in the first vibration mode.

An effect that the vibration isolation members 7 give to the vibration excited in the vibration body 1 will be described. The nodal lines L1 through L5 and the areas A1 through A3 where the vibration displacements are large appear on the vibration body 1 at the side of the piezoelectric device 4 in the same manner as shown in FIG. 3A. Even if the vibration isolation members 7 are elastic, when high face pressure acts on the areas A1 through A3 that are antinodes of the vibration, the vibration excited in the vibration body 1 will be reduced and efficiency will be lowered. Moreover, the resonance frequency of the vibration mode becomes large (shifts to the high frequency side) because the antinodes of the vibration are restricted. Accordingly, when the resonance frequency of one vibration mode of which the antinodes are restricted becomes large while the resonance frequency of the other vibration mode does not vary, the difference between the resonance frequencies of two vibration modes, which are designed optimally, will vary. As a result, since the loci of the elliptic movements appearing at the projections 3 by compositing the two vibration modes vary, the vibration body 1 cannot generate sufficient friction driving force for driving the driven body 6, which causes a problem that a drive performance (output characteristics) falls. Accordingly, it is required to apply the pressure force as near to the nodal lines as possible while avoiding the antinodes of the vibration in order to prevent degradation of the drive performance of the vibration actuator 100.

However, if the pressure force is applied to the vibration body 1 in a narrow area near the nodal lines, the vibration isolation members 7 will be crushed because the face pressure becomes high. If the elasticity of the vibration isolation members 7 becomes small, excitation of the vibration will be obstructed, and the performance of the vibration actuator 100 cannot be maintained in the long term. Accordingly, it is preferable that the area of pressurizing regions by the vibration isolation members 7 be as wide as possible. From such a viewpoint, the pressurizing regions by the vibration isolation members 7 are set up as described hereinafter in the vibration actuator 100.

Figure 3B:
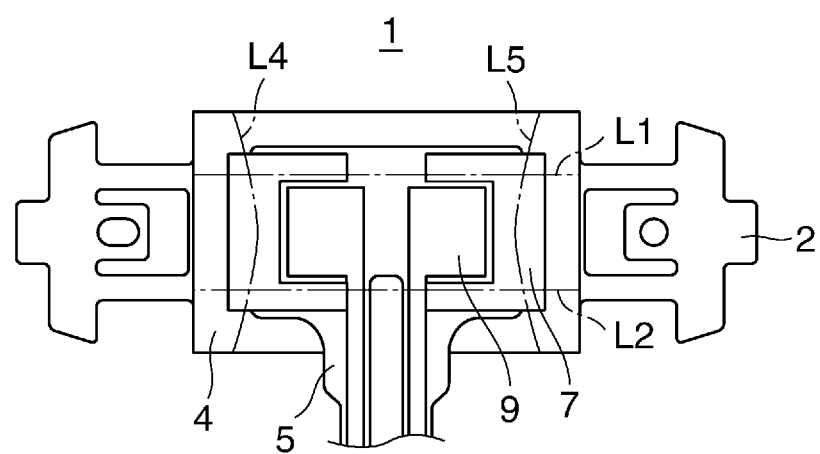
FIG. 3B is a plan view describing a relationship between the vibration body and a vibration isolation member in the vibration actuator shown in FIG. 1.

FIG. 3B is a plan view describing the relation between the vibration body 1 and the vibration isolation members 7. The piezoelectric device 4 is pasted on the main part of the elastic body 2, and the flexible substrate 5 is pasted on the piezoelectric device 4. The electrode terminals 9 are provided in the flexible substrate 5, and the electrode terminals 9 are electrically connected as the electrode of the piezoelectric device 4. As described with reference to FIG. 2A and FIG. 2B the elliptic movements occur at the front ends of the projections 3 established on the vibration body 1 by applying the alternating voltages of which the phases are different to the piezoelectric device 4 through the flexible substrate 5.

The electrode terminals 9 are pasted so as to overlap with parts of the areas A1 through A3 in which the antinodes of the first and second vibration modes appear. Since the excitation of vibration may be obstructed when the areas near the antinodes of the vibration are pressed strongly, the pressurizing region to the piezoelectric device 4 needs to avoid the electrode terminals 9. Accordingly, the pressurizing region to the piezoelectric device 4 is set up so that the regions on the nodal lines L4 and L5 in the first vibration mode, the regions on the nodal lines L1 and L2 in the second vibration mode, a part of the area A1 of the antinode in the second vibration mode, and parts of the areas A2 and A3 of the antinodes in the first vibration mode are pressed. This reduces the face pressure that acts on the piezoelectric device 4, and obtains a stable pressure state while minimizing a function that reduces the excitation of vibration.

Figure 4:
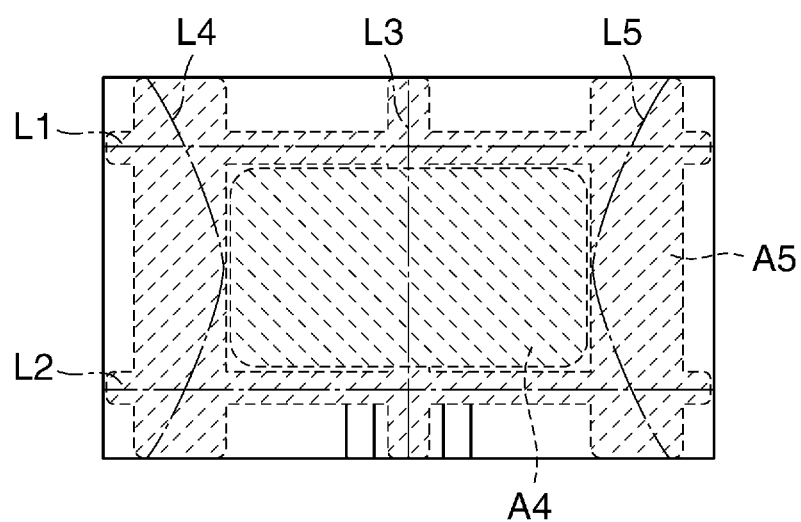
FIG. 4 is a view describing a pressurizing region to the vibration body of the vibration actuator shown in FIG. 1.

Hereinafter, ideal shapes of the vibration isolation members 7 will be described. FIG. 4 is a view describing an area in which the pressure force is applied to the vibration body 1. Generally, the flexible substrate 5 consists of the electrode terminals 9 and a resin part surrounding the circumference. Thickness of the flexible substrate 5 is uneven and is largest near the electrode terminals 9. Accordingly, when the area A4 of the electrode terminals 9 is pressurized, the face pressure of the electrode terminals 9 and its vicinity will become large, which reduces the vibrations in the first and second vibration modes. Accordingly, the vibration isolation members 7 need to be designed so as to press the piezoelectric device 4 while avoiding the area A4 in which the electrode terminals 9 are arranged. Moreover, it is necessary to press the area A5 that includes both the parts of the nodal lines L4 and L5 in the first vibration mode and the parts of the nodal lines L1 and L2 in the second vibration mode in order not to obstruct the excitation of vibration in the vibration body 1.

Accordingly, each of the vibration isolation members 7 is shaped in a channel shape that partially overlaps with the nodal lines L4 and L5 in the first vibration mode and the nodal lines L4 and L5 in the second vibration mode so as to give the pressure force to the piezoelectric device 4 with low face pressure within the area A5 while avoiding the area A4. On the other hand, when the area of the nodal line in one of the first vibration mode and the second vibration mode is pressed, the vicinity of the antinode in the other vibration mode in the area that overlaps with the nodal line is inevitably pressed, which changes the frequency characteristics in the vibration mode of which the vicinity of the antinode is pressed. However, since the vibration isolation members 7 press the vicinity of the antinodes in both of the first vibration mode and the second vibration mode, the frequency characteristics of both vibration modes vary similarly. Accordingly, the size relation between the resonance frequency in the first vibration mode and the resonance frequency in the second vibration mode is maintained, and degradation of the drive performance of the vibration body 1 is avoidable. It should be noted that the resonance frequency in the second vibration mode is always smaller than the resonance frequency in the first vibration mode.

Moreover, since the face pressure acting on the piezoelectric device 4 is lowered by pressing the piezoelectric device 4 in a large area by the vibration isolation members 7, the amplitude of the vibration is not largely lowered even if the antinodes of the vibration are pressurized. It should be noted that the face pressure that the pressing member 8 applies to the vibration isolation members 7 is preferably smaller than the face pressure that deprives of elasticity when the vibration isolation members 7 are pressurized. Furthermore, the vibration isolation members 7 press the piezoelectric device 4 in the areas that do not overlap with the electrode terminals 9. The concentration of the pressure force to the areas A1 through A3 that include the antinodes of the vibrations in the first and second vibration modes and to the vicinity of the electrode terminals 9 that are thick is avoidable. This reduces the degradation of the vibration amplitude due to obstruction of the excitation of the vibrations in the first and second vibration modes by pressurizing the piezoelectric device 4 by the vibration isolation members 7.

As mentioned above, the vibration body 1 is pressed toward the driven body 6 through the vibration isolation members 7 in a first area that includes both the two nodal lines L4 and L5 in the first vibration mode and the area A1 of the antinode in the second vibration mode in the vibration actuator 100. Moreover, the vibration body 1 is pressed toward the driven body 6 through the vibration isolation members 7 in the first area and also in a second area that includes both the two nodal lines L1 and L2 in the second vibration mode and the areas A2 and A3 of the antinodes in the first vibration mode in the vibration actuator 100. Thus, the vibration body 1 comes into press contact with the driven body 6 in a state where the face pressure in both the first and second areas becomes higher than that in the other area. Thus, since the face pressure acting on the vibration body 1 is lowered by giving the pressure force to the vibration body 1 in the large area, the excitation of the vibration in the vibration body 1 becomes hard to be obstructed. Moreover, since the change of the size relation between the resonance frequencies in the first and second vibration modes is reduced, the degradation of the drive performance of the vibration actuator 100 is reduced.

Figure 5A:
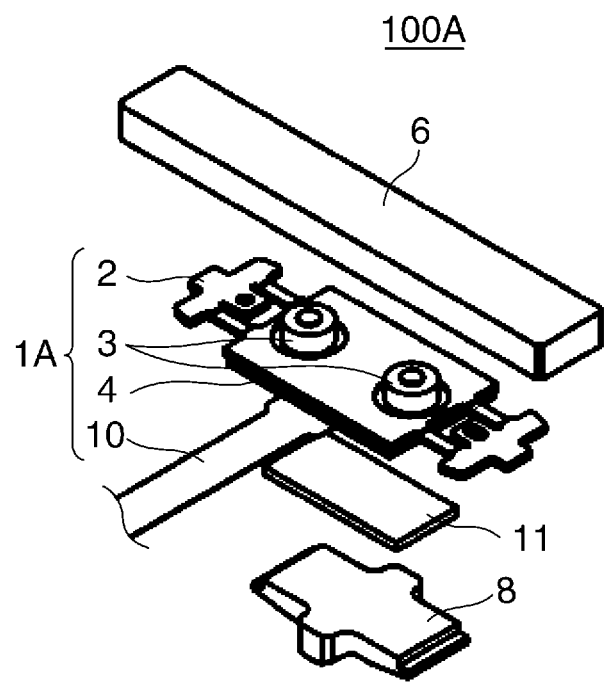
FIG. 5A is an exploded perspective view schematically showing a configuration of a vibration actuator according to a second embodiment of the present invention.

Next, a vibration actuator according to a second embodiment of the present invention will be described. FIG. 5A is an exploded perspective view schematically showing a configuration of the vibration actuator 100A according to the second embodiment of the present invention. The vibration actuator 100A differs from the vibration actuator 100 according to the first embodiment in configurations of a flexible substrate and a vibration isolation member. Accordingly, the vibration actuator 100A has a vibration body 1A, the driven body 6, the pressing member 8, and a vibration isolation member 11. The vibration body 1A has the elastic body 2, the two projections 3, the piezoelectric device 4, and a flexible substrate 10. Since the elastic body 2, projections 3, piezoelectric device 4, driven body 6, and pressing member 8 are the same as what constitutes the vibration actuator 100 according to the first embodiment, their descriptions are omitted. The vibration isolation member 11 is tabular and rectangular.

Figure 5B:
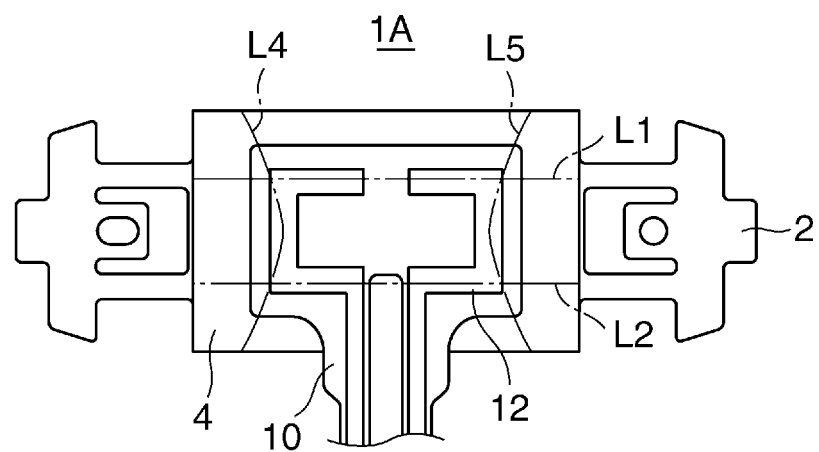
FIG. 5B is a plan view schematically showing a configuration in a state where a flexible substrate that is a component of the vibration actuator shown in FIG. 5A is attached to the vibration body.

FIG. 5B is a plan view schematically describing a configuration in a state where the flexible substrate 10 is attached to the vibration body 1A. The flexible substrate 10 has electrode terminals 12. The electrode terminals 12 are formed in channel shapes that partially overlap with the nodal lines L4 and L5 in the first vibration mode and the nodal lines L1 and L2 in the second vibration mode. The areas of the electrode terminals 12 are thicker than the other area of the flexible substrate 10. Accordingly, although the vibration isolation member 11 is rectangular, it gives the piezoelectric device 4 the pressure in the areas of the electrode terminals 12 approximately. That is, the electrode terminals 12 of the vibration actuator 100A play the role of the vibration isolation members 7 that constitute the vibration actuator 100. Accordingly, the vibration actuator 100A also takes the same effect as the vibration actuator 100. Moreover, since the vibration isolation member 11 has a simple rectangular shape in the vibration actuator 100A, cutting (processing) from a sheet-shaped raw material is easy, and a sheet-shaped raw material is used without futility.

Figure 6:
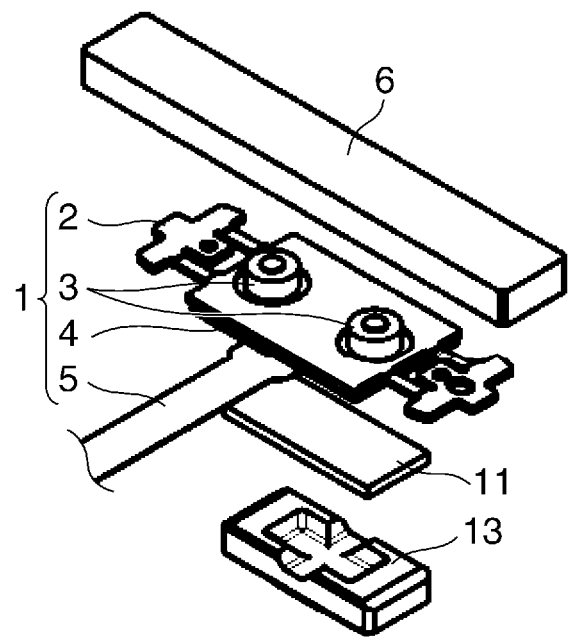
FIG. 6 is an exploded perspective view schematically showing a configuration of a vibration actuator according to a third embodiment of the present invention.

Next, a vibration actuator according to a third embodiment of the present invention will be described. FIG. 6 is an exploded perspective view schematically showing a configuration of the vibration actuator 100B according to the third embodiment of the present invention. The vibration actuator 100B differs from the vibration actuator 100 according to the first embodiment in configurations of a vibration isolation member and a pressing member. The vibration actuator 100B is provided with the vibration body 1, the driven body 6, the vibration isolation member 11, and a pressing member 13. Since the vibration body 1 is the same as what constitutes the vibration actuator 100 according to the first embodiment and the vibration isolation member 11 is the same as what constitutes the vibration actuator 100A according to the second embodiment, their descriptions are omitted.

In the vibration actuator 100, the area (the contact area between the vibration body 1 and the vibration isolation member 11) in which the face pressure acting to the vibration body 1 becomes high is set up by devising the shape of the vibration isolation member 11. On the other hand, in the vibration actuator 100B, the area in which the face pressure acting to the vibration body 1 becomes high is set up by devising the shape of the pressing member 13. That is, an approximately cruciform groove is formed on one side surface of the pressing member 13. The approximately cruciform groove has a first groove portion formed in parallel to short sides and a second groove portion formed in parallel to long sides. The first groove portion passes the centers of the long sides and pierces the long sides. The second groove portion passes the center in a short-side direction and does not pierce the short sides. Accordingly, when the pressing member 13 gives the vibration body 1 the pressure through the vibration isolation member 11, the portion of the approximately cruciform groove does not give the vibration body 1 the pressure force approximately. Then, the area (projected area) around the groove formed on the pressing member 13 gives the piezoelectric device 4 the pressure force through the vibration isolation member 11. The area around the groove on the pressing member 13 corresponds to the area including parts of the nodal lines L4 and L5 in the first vibration mode and parts of the nodal lines L1 and L2 in the second vibration mode, Accordingly, the same effect as the case using the channel-shaped vibration isolation members 7 of the first embodiment is obtained.

Accordingly, the vibration actuator 100B produces the same effect as the vibration actuator 100. Moreover, the area in which the face pressure becomes high when the piezoelectric device 4 is pressed is determined according to the shape of the pressing member 13. Since the pressing member 13 is able to be manufactured with processing accuracy higher than that of the vibration isolation members 7, the vibration actuator 100B reduces variation of the characteristic for each individual.

Next, a vibration actuator according to a fourth embodiment of the present invention will be described. The vibration actuator according to the fourth embodiment has a configuration in which the shapes of the vibration isolation members 7 of the vibration actuator 100 according to the first embodiment are changed. Accordingly, the descriptions about the components that are common with the vibration actuator 100 are omitted.

Figure 7:
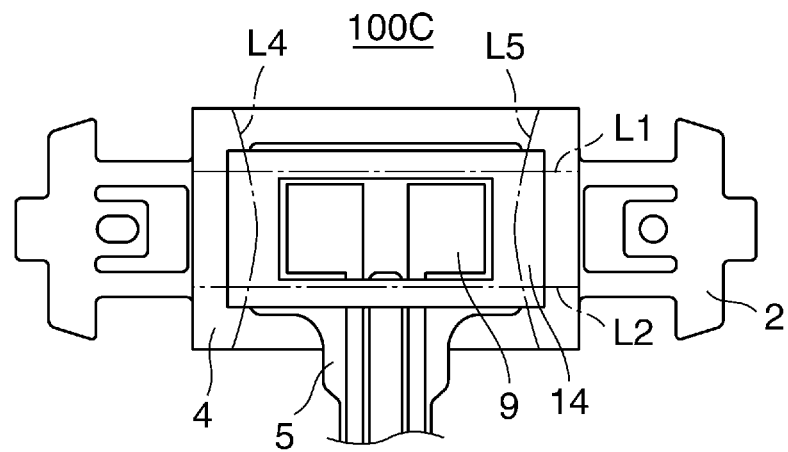
FIG. 7 is a plan view showing a vibration actuator according to a fourth embodiment of the present invention viewed from a side of a vibration isolation member.

FIG. 7 is a plan view showing the vibration actuator 100C according to the fourth embodiment of the present invention viewed from a side of a vibration isolation member 14. Although the first embodiment employs the approximately channel-shaped vibration isolation members 7, the fourth embodiment employs the vibration isolation member 14 of one square framed shape that connected the two vibration isolation members 7. The square framed shape of the vibration isolation member 14 is set up to give pressure force to the piezoelectric device 4 in an area including parts of the nodal lines L4 and L5 in the first vibration mode and parts of the nodal lines L1 and L2 in the second vibration mode.

Accordingly, the vibration actuator 100C takes the same effect as the vibration actuator 100. Moreover, since the vibration actuator 100C employs the one vibration isolation member 14, variation of the characteristic for each individual due to a fabrication error is reduced. It should be noted that the third embodiment takes the effect of the fourth embodiment by changing the shape of the groove on the pressing member 13 to a square shape (by forming the groove so that the surface of the pressing member 13 is projected in the square framed shape).

Next, a vibration actuator according to a fifth embodiment of the present invention will be described. The vibration actuator according to the fifth embodiment has a configuration in which the shapes of the vibration isolation members 7 of the vibration actuator 100 according to the first embodiment are changed. Accordingly, the descriptions about the components that are common with the vibration actuator 100 are omitted.

Figure 8:
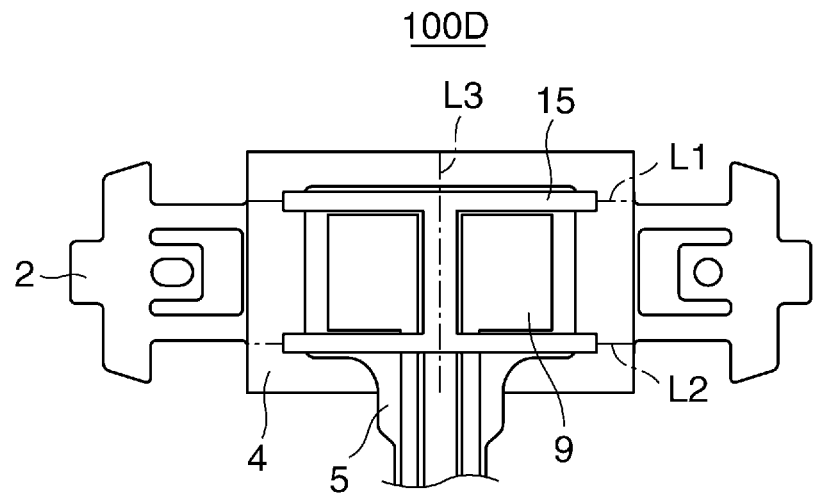
FIG. 8 is a plan view showing a vibration actuator according to a fifth embodiment of the present invention viewed from a side of a vibration isolation member.

FIG. 8 is a plan view showing the vibration actuator 100D according to the fifth embodiment of the present invention viewed from a side of the vibration isolation member 15. The vibration isolation member 15 has an approximately H-shape, and is designed so as to give the piezoelectric device 4 the pressure force from the pressing member 8 in an area including a part of the nodal line L3 in the first vibration mode and parts of the nodal lines L1 and L2 in the second vibration mode. Moreover, since the vibration isolation member 15 gives the pressure to parts of the areas A2 and A3 of the antinodes in the first vibration mode and a part of the area A1 of the antinode in the second vibration mode, the size relation between the resonance frequency in the first vibration mode and the resonance frequency in the second vibration mode is maintained. Furthermore, since the shape of the vibration isolation member 15 is designed so as not to give the pressure force to the electrode terminals 9, the concentration of the pressure force to the area A1 of the antinode in the second vibration mode and to the vicinity of the electrode terminals 9 that are thick because of overlapping with the flexible substrate 5 is avoidable. Accordingly, the vibration actuator 100D also takes the same effect as the vibration actuator 100. It should be noted that the vibration actuator 100B according to the third embodiment takes the same effect as the fifth embodiment by forming the groove so that the surface of the pressing member 13 is projected in the approximately H-shape.

Next, a vibration actuator according to a sixth embodiment of the present invention will be described. Since the vibration actuator according to the sixth embodiment is different from the vibration actuator 100 according to the first embodiment in a configuration of a flexible substrate, the descriptions about the components that are common to the vibration actuator 100 are omitted.

Figure 9:
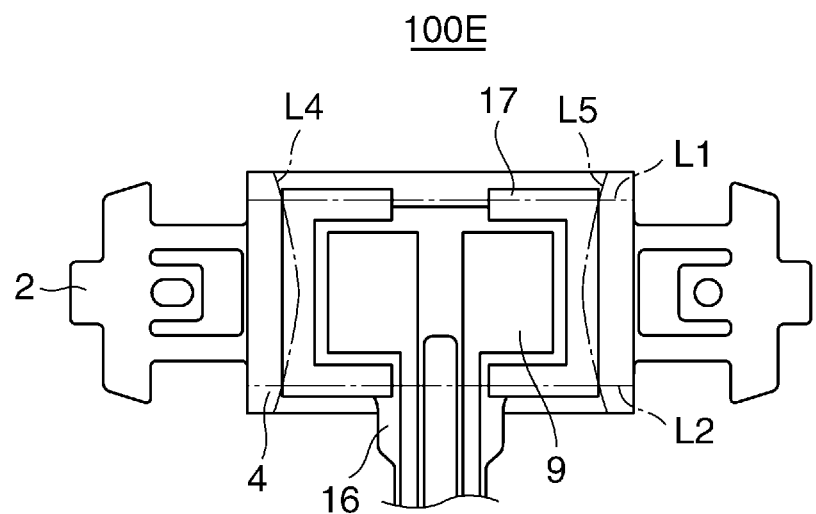
FIG. 9 is a plan view showing a vibration actuator according to a sixth embodiment of the present invention viewed from a side of a flexible substrate.

FIG. 9 is a plan view showing the vibration actuator 100E according to the sixth embodiment of the present invention viewed from a side of a flexible substrate 16. The flexible substrate 16 has the electrode terminal 9 and two approximately channel-shaped thick parts 17 that surround the electrode terminals 9. The thick parts 17 are thicker than the electrode terminal 9, and are made from resin material that is used to reinforce the flexible substrate 16, metal material that is used to form the electrode terminals 9, etc.

The thick parts 17 are provided in the area corresponding to parts of the nodal lines L4 and L5 in the first vibration mode and parts of the nodal lines L1 and L2 in the second vibration mode. Accordingly, when the pressure force is given from the pressing member 8 to the piezoelectric device 4 through the vibration isolation member 11, the face pressure in the thick parts 17 that are thicker than the electrode terminal 9 becomes higher, which takes the same effect as the first embodiment. Moreover, since the area where the face pressure is given to the piezoelectric device 4 is determined on the basis of the configuration of the flexible substrate 16, the degree of freedom of the configurations of the vibration isolation member and the pressing member is raised. It should be noted that the thick parts 17 may be formed in the square framed shape shown in the fourth embodiment or the approximately H-shape shown in the fifth embodiment. It is enough to change the shape of the electrode terminals according to the shapes of the thick parts 17.

Figure 10A:
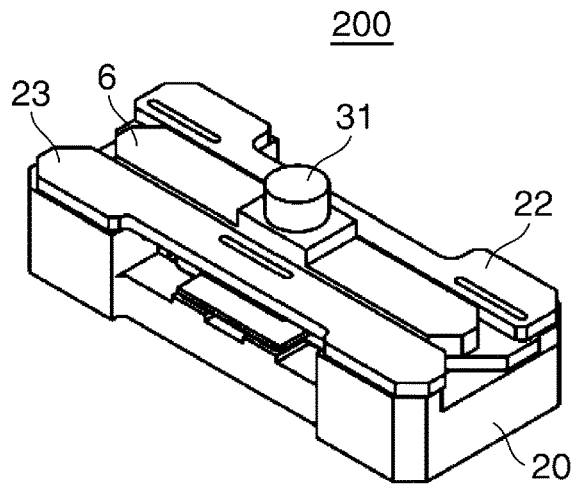
FIG. 10A is an external perspective view schematically showing a configuration of a drive unit using the vibration actuator shown in FIG. 1.
Figure 10B:
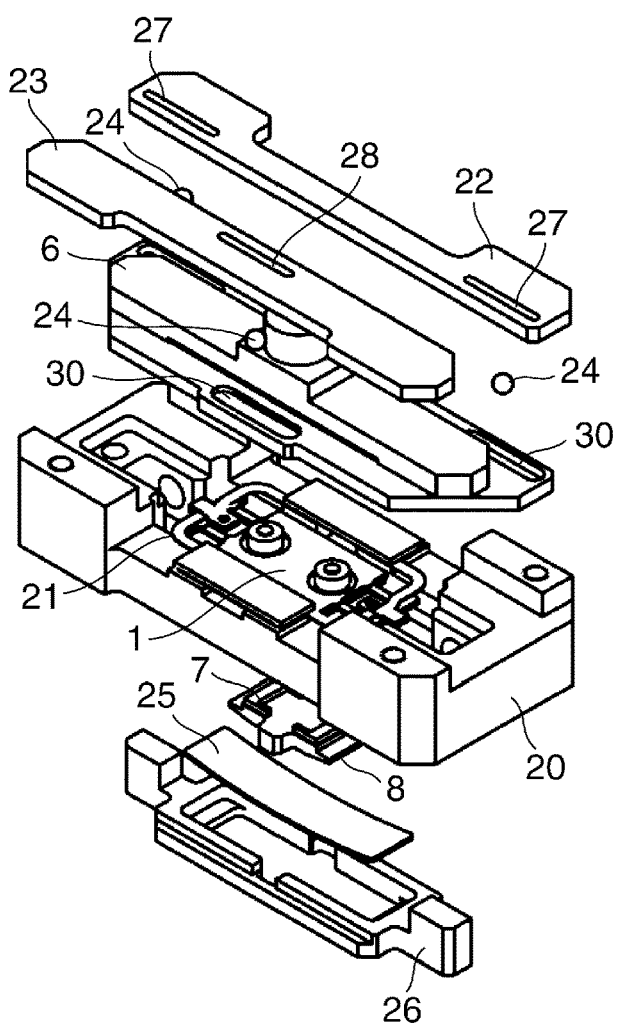
FIG. 10B is an exploded perspective view showing the drive unit shown in FIG. 10A.

Next, a configuration example of a drive unit using the vibration actuator 100 according to the first embodiment will be described. FIG. 10A is an external perspective view showing the drive unit 200 using the vibration actuator 100, and FIG. 10B is an exploded perspective view showing the drive unit 200. It should be noted that the drive unit 200 may be configured by using one of the vibration actuators 100A through 100E according to the second through sixth embodiments in place of the vibration actuator 100.

An output shaft 31 is provided on the upper surface of the driven body 6 (the side opposite to the frictional contact surface with the vibration body 1) that constitutes the vibration actuator 100. It should be noted that the shape of the driven body 6 has been changed to the shape that is suitable for the drive unit 200 from the shape shown in FIG. 1. The both ends of the vibration body 1 in the longitudinal direction (the arms of the elastic body 2) are connected to the elastic body 21 of which rigidity is smaller than the elastic body 2. A part of the elastic body 21 is fixed to the base 20. Accordingly, since the vibration body 1 has a degree of freedom in a roll direction with respect to the driving direction (the direction connecting the two projections 3) and is able to trace the surface of the driven body 6, the driven body 6 and the vibration body 1 are maintainable in the stable pressurized contact state.

Rolling balls 24 are respectively and rotatably arranged between three ball seats 30 formed in the driven body 6 and two grooves 27 formed in a first fixed rail 22 and a groove 28 formed in a second fixed rail 23. The first fixed rail 22 and the second fixed rail 23 are fixed to the base 20, and accordingly, the driving direction and position of the driven body 6 are determined. It should be noted that a method of determining the moving direction and position of the driven body 6 is not limited to the method of using the rolling balls 24. A member, such as a slide rail, that enables a linear movement may be used. Receiving the pressure force by the flat spring 25, the pressing member 8 brings the vibration body 1 into pressure contact with the driven body 6 through the vibration isolation member 7 adhered on the pressing member 8. The vibration isolation member 7 may be adhered to the vibration body 1 instead of the pressing member 8. The pressure force that the flat spring 25 generates is determined by fixing a flat-spring holding member 26 to a predetermined position of the base 20. A compression spring, a cone spring, etc. may be used in place of the flat spring 25. The drive unit 200 moves the driven body 6 in the longitudinal direction of the drive unit 200 (the direction connecting the two projections 3 of the vibration body 1) by exciting the vibrations in the first vibration mode and second vibration mode, which were described with reference to FIG. 2A and FIG. 2B, with predetermined phase difference in the vibration body 1.

Figure 11:
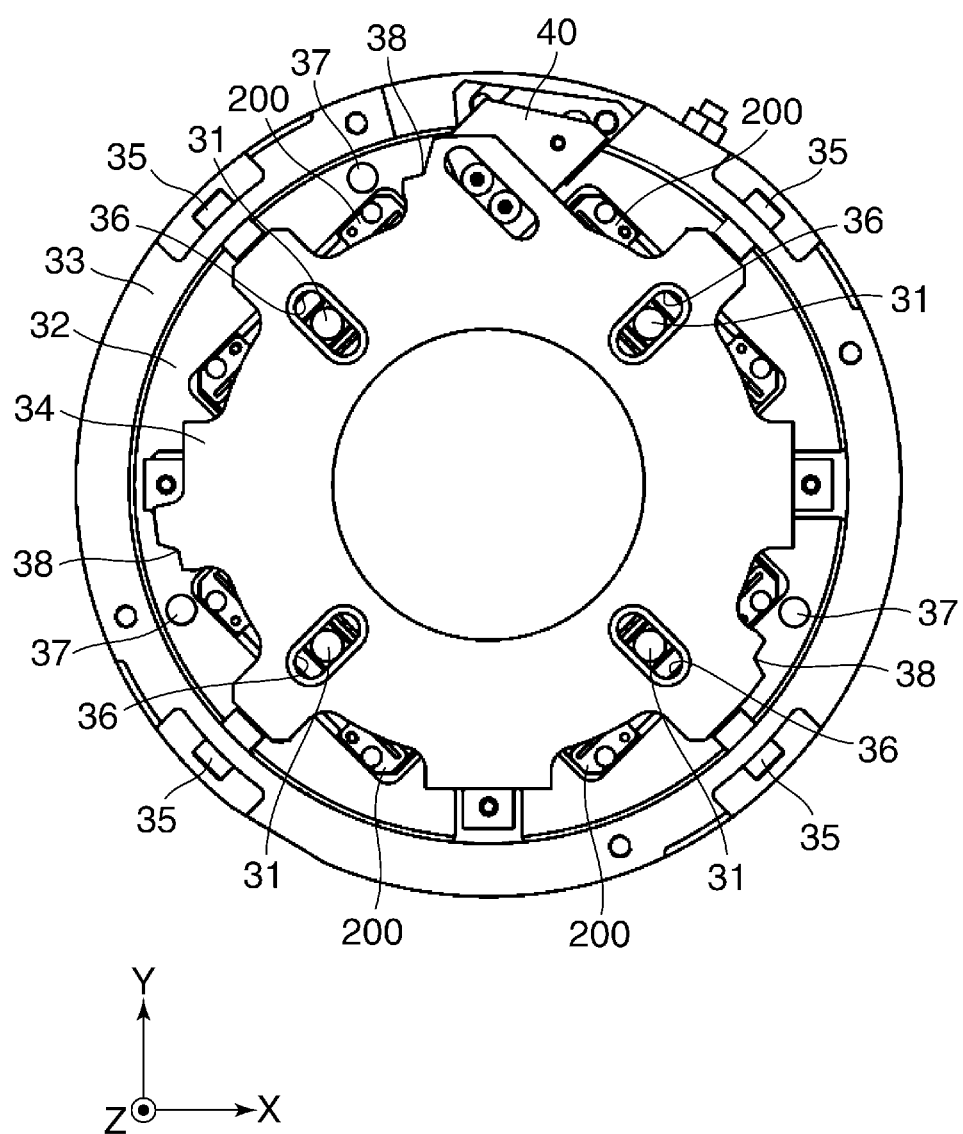
FIG. 11 is a plan view schematically showing a configuration of a translational driving apparatus using the drive unit shown in FIG. 10A.

FIG. 11 is a plan view schematically showing a configuration of a translational driving apparatus 250 constituted by using the drive unit 200. The translational driving apparatus 250 has a rotation regulating mechanism 40, a fixing part 33 that supports the rotation regulating mechanism 40, a rotating part 32 that supports the four drive units 200 and is relatively rotatable with respect to the fixing part, and a movable body 34. Four support rollers 35 are combined with the movable body 34. The movable body 34 is translatable in an X-Y plane with respect to the fixing part 33 because the support rollers 35 engage with roller guide grooves formed on the fixing part 33. Four thrust receiving grooves 36 that respectively engage with the output shafts 31 provided in the driven bodies 6 are formed in the movable body 34. When the thrust receiving grooves 36 receive thrust in their short-side direction from the output shafts 31, the movable body 34 is moved. On the other hand, the output shafts 31 are respectively movable inside the thrust receiving grooves 36 in their longitudinal direction. Accordingly, the movable body 34 is movable in any direction in the X-Y plane by driving each of the output shafts 31 of the four drive units 200 in predetermined directions.

It should be noted that the movable body 34 is regulated by the rotation regulating mechanism 40 so as not to rotate in the X-Y plane. Accordingly, when the driving force for driving the movable body 34 counter clockwise in FIG. 11 is generated, its reaction force will rotate the rotating part 32 clockwise, and pins 37 provided in the rotation section 32 will engage with engagement parts 38 provided in the movable body 34. In this state, the translation of the movable body 34 in the X-Y plane is regulated.

Figure 12:
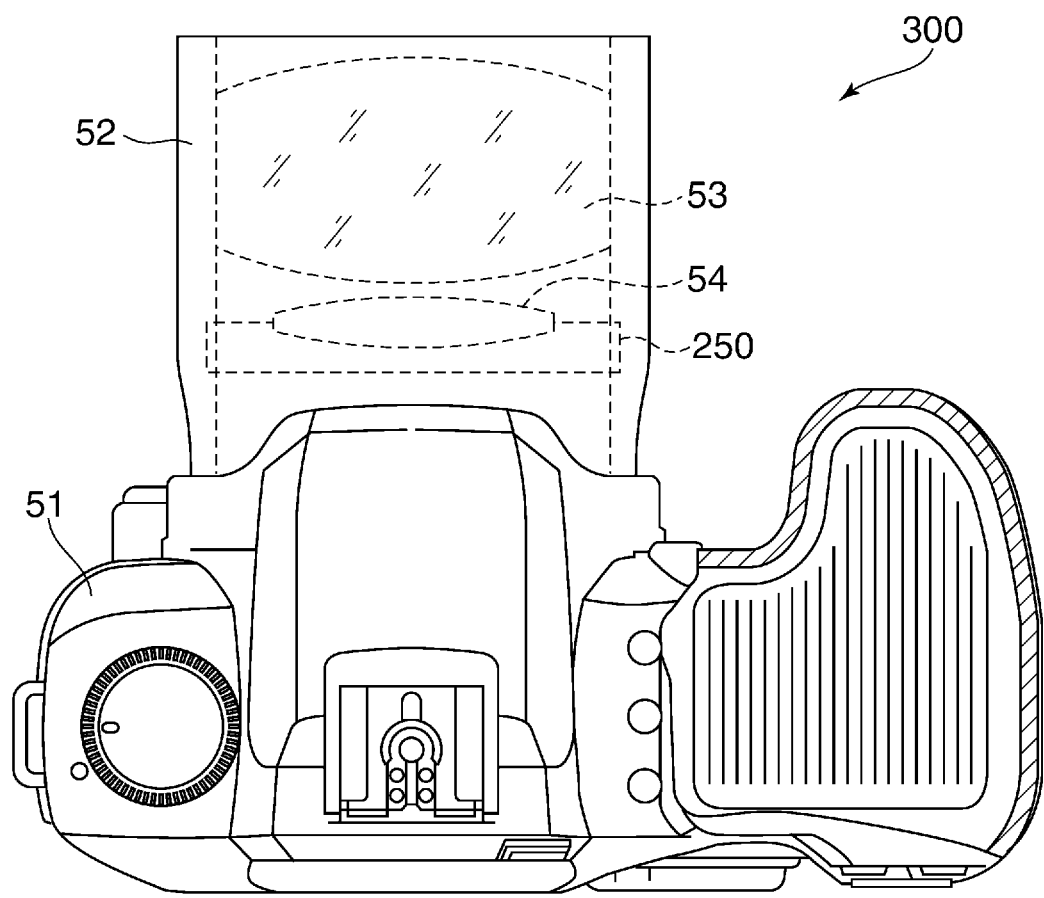
FIG. 12 is a top plan view schematically showing a configuration of an image pickup apparatus equipped with the translational driving apparatus shown in FIG. 11.

Next, an image pickup apparatus as an example of an electronic apparatus equipped with the translational driving apparatus 250 will be described below. FIG. 12 is a top plan view schematically showing a configuration of the image pickup apparatus 300 equipped with the translational driving apparatus 250. The image pickup apparatus 300 includes an apparatus body 51 that contains an image pickup device (not shown) and a lens barrel 52 that is detachably attached to the apparatus body 51. The lens barrel 52 has a plurality of lens groups 53 and the translational driving apparatus 250 as an image stabilization device that corrects a blur of an object image. The translational driving apparatus 250 has an image stabilization lens 54 that is fixed to a center hole of the movable body 34, and is arranged in the lens barrel 52 so that the Z-direction shown in FIG. 11 coincides with an optical axis direction of the lens barrel 52.

Light flux passed through the lens group 53 and the correction lens 54 forms an image on the image pickup device. The image pickup device converts the optical image into an electrical signal by photoelectric conversion, and outputs it to an image processing circuit of the image pickup apparatus 300. The image processing circuit generates image data from the received electrical signal. The image stabilization lens 54 is moved in the plane that intersects perpendicularly with the optical axis in order to correct an image blur resulting from a camera shake, etc., which enables to take a clear image. It should be noted that the image pickup device may be held by the movable body 34 of the translational driving apparatus 250 so that the image pickup device is moved in the plane that intersects perpendicularly with the optical axis in order to correct an image blur resulting from a camera shake, etc.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

Furthermore, the embodiments mentioned above show examples of the present invention, and it is possible to combine the embodiments suitably. For example, a mechanism that moves a lens group in the lens barrel 52 in the optical axis direction using the drive unit 200 mentioned above may also be constituted. For example, the drive unit 200 should be arranged in the lens barrel 52 so that the driving direction of the driven body 6 is approximately parallel to the optical axis direction. Then, when the lens holding member that holds the lens is combined with the driven body 6, autofocusing or zooming is available by driving the driven body 6 to move the lens holding member in the optical axis direction. It should be noted that the lens holding member may be combined with the vibration body instead of the driven body. An application of the drive unit 200 is not limited to an image pickup apparatus nor a copying machine. The drive unit 200 can be applied to various electronic devices, such as a robot and an X-Y stage, which are equipped with movable members.

This application claims the benefit of Japanese Patent Application No. 2016-090976, filed Apr. 28, 2016, which is hereby incorporated by reference herein in its entirety.

What is claimed is:

1. A vibration actuator comprising:
    a vibration body that has an electro-mechanical energy conversion element;
    a driven body in contact with the vibration body;
    a pressing member that applies a pressing force to the vibration body; and
    a vibration isolation member that is arranged between the vibration body and the pressing member,
    wherein the vibration body and the driven body move relatively due to a vibration in a first vibration mode and a vibration in a second vibration mode that are excited in the vibration body, and
    wherein face pressure that acts on the electro-mechanical energy conversion element by the pressing member in both a first area including a part of a nodal line in the first vibration mode and its vicinity and a second area including a part of a nodal line in the second vibration mode and its vicinity is higher than that in an area of the electro-mechanical energy conversion element other than the first and second areas.

2. The vibration actuator according to claim 1, wherein the first area includes a part of an antinode of a vibration in the second vibration mode, and the second area includes a part of an antinode of a vibration in the first vibration mode.

3. The vibration actuator according to claim 1, wherein the vibration isolation member has a shape that contacts the vibration body in the first area and the second area.

4. The vibration actuator according to claim 1, wherein areas corresponding to the first area and the second area on a surface of the pressing member that contacts the vibration isolation member are projected relative to the area other than the first and second areas.

5. The vibration actuator according to claim 1, wherein the vibration body is provided with a flexible substrate joined to the electro-mechanical energy conversion element, and
    wherein the flexible substrate is formed so that areas corresponding to the first area and the second area are thicker than the area other than the first and second areas.

6. The vibration actuator according to claim 5, wherein the thicker formed areas of the flexible substrate are formed so as to avoid an electrode terminal that is electrically connected with an electrode of the electro-mechanical energy conversion element.

7. The vibration actuator according to claim 1, wherein the vibration body is provided with an elastic body that is joined to the electro-mechanical energy conversion element, wherein a portion of the elastic body to which the electromechanical energy conversion element is joined is tabular and approximately rectangular, wherein the vibration body has two projections that are arranged on the elastic body with a predetermined separation in a relative moving direction of the vibration body and the driven body and that come into press contact with the driven body, and wherein a vibration in the first vibration mode is a secondary bending vibration that has a nodal line that intersects perpendicularly with a longitudinal direction of the vibration body, and a vibration in the second vibration mode is a primary bending vibration that has a nodal line that intersects perpendicularly with a short-side direction of the vibration body.

8. The vibration actuator according to claim 1, wherein face pressure that is applied to the vibration isolation member is lower than face pressure that deprives of elasticity when the vibration isolation member is pressed.

9. The vibration actuator according to claim 1, wherein the vibration isolation member is made from one of felt, synthetic leather, moltoprene, and rubber.

10. An electrical apparatus comprising:
   a vibration actuator comprising a vibration body according to claim 1; and
   a member that is moved by the vibration actuator.

11. The vibration actuator according to claim 1, wherein the vibration isolation member is of a channel shape.

12. The vibration actuator according to claim 1, wherein the vibration isolation member is of a single square-framed shape.

13. The vibration actuator according to claim 1, wherein the vibration isolation member is in an H-shape.

14. An image pickup apparatus comprising:
   a lens;
   an image pickup device; and
   a vibration actuator according to claim 1,
   wherein the lens and the image pickup device move relatively due to the vibration actuator.

* * * * *